United States Patent
Donachy et al.

(10) Patent No.: US 10,649,507 B2
(45) Date of Patent: May 12, 2020

(54) POWER OVER ETHERNET COOLING SYSTEM

(71) Applicant: DELL PRODUCTS, LP, Round Rock, TX (US)

(72) Inventors: John C. Donachy, Austin, TX (US);
David L. Moss, Austin, TX (US);
Mark A. Muccini, Georgetown, TX (US)

(73) Assignee: Dell Products, L.P., Round Rock, TX (US)

( * ) Notice: Subject to any disclaimer, the term of this patent is extended or adjusted under 35 U.S.C. 154(b) by 164 days.

(21) Appl. No.: 15/683,479

(22) Filed: Aug. 22, 2017

(65) Prior Publication Data
US 2019/0064890 A1  Feb. 28, 2019

(51) Int. Cl.
| | | |
|---|---|---|
| G06F 1/20 | (2006.01) | |
| G06F 1/26 | (2006.01) | |
| H05K 7/20 | (2006.01) | |
| F28F 27/02 | (2006.01) | |
| H04L 12/10 | (2006.01) | |
| H04L 12/28 | (2006.01) | |
| H04L 12/40 | (2006.01) | |

(52) U.S. Cl.
CPC .......... *G06F 1/206* (2013.01); *F28F 27/02* (2013.01); *G06F 1/20* (2013.01); *G06F 1/26* (2013.01); *H04L 12/10* (2013.01); *H04L 12/2827* (2013.01); *H05K 7/20754* (2013.01); *H05K 7/20836* (2013.01); *H04L 12/40045* (2013.01)

(58) Field of Classification Search
CPC .................................................. H05K 7/20754
USPC .......................................................... 700/300
See application file for complete search history.

(56) References Cited

U.S. PATENT DOCUMENTS

| | | | |
|---|---|---|---|
| 7,308,705 B2 | 12/2007 | Gordy et al. | |
| 9,465,425 B2 | 10/2016 | Hamdi et al. | |
| 2006/0164447 A1* | 7/2006 | Poole | B41J 29/393 347/5 |
| 2013/0311793 A1* | 11/2013 | Chang | G06F 1/206 713/300 |
| 2015/0162229 A1 | 6/2015 | Tanimura et al. | |
| 2015/0378410 A1 | 12/2015 | Hamdi et al. | |
| 2016/0164688 A1* | 6/2016 | Yseboodt | H05B 37/0254 307/1 |
| 2016/0265224 A1* | 9/2016 | Byers | E04G 23/00 |
| 2017/0026188 A1* | 1/2017 | Herzel | H04L 12/10 |
| 2018/0306457 A1* | 10/2018 | Byers | F24F 11/30 |

* cited by examiner

*Primary Examiner* — Emilio J Saavedra
(74) *Attorney, Agent, or Firm* — Larson Newman, LLP

(57) ABSTRACT

A portable or modular cooling system is operated via the power-over-Ethernet (PoE) standard. The cooling system receives electrical power via an Ethernet connection to a source device (such as a server, switch, or other PoE-enabled equipment). The cooling system may thus be used to spot-inject cooler ambient air in the vicinity of the source device without the need for grid electric and for cumbersome electrical wiring.

18 Claims, 10 Drawing Sheets

| PSU PRESENT & HEALTHY | (1) POE 1 | (2) POE 2 | (3) FAN 1 | (4) FAN 2 | (5) POE PSU |
|---|---|---|---|---|---|
| TRUE | CONN | CONN | CONN | CONN | OPEN |
| FALSE | OPEN | OPEN | CONN | CONN | CONN |

POWER OVER ETHERNET COOLING SYSTEM

FIELD OF THE DISCLOSURE

The present disclosure generally relates to information handling systems, and more particularly relates to thermal management.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A portable or modular cooling system is operated via the power-over-Ethernet (PoE) standard. The cooling system receives electrical power via an Ethernet connection to a source device such as a server, switch, or other PoE-enabled equipment. The cooling system may thus be used to spot-inject cooler ambient air in the vicinity of the source device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIGS. 6-8 illustrate logical and electrical connections, according to exemplary embodiments;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
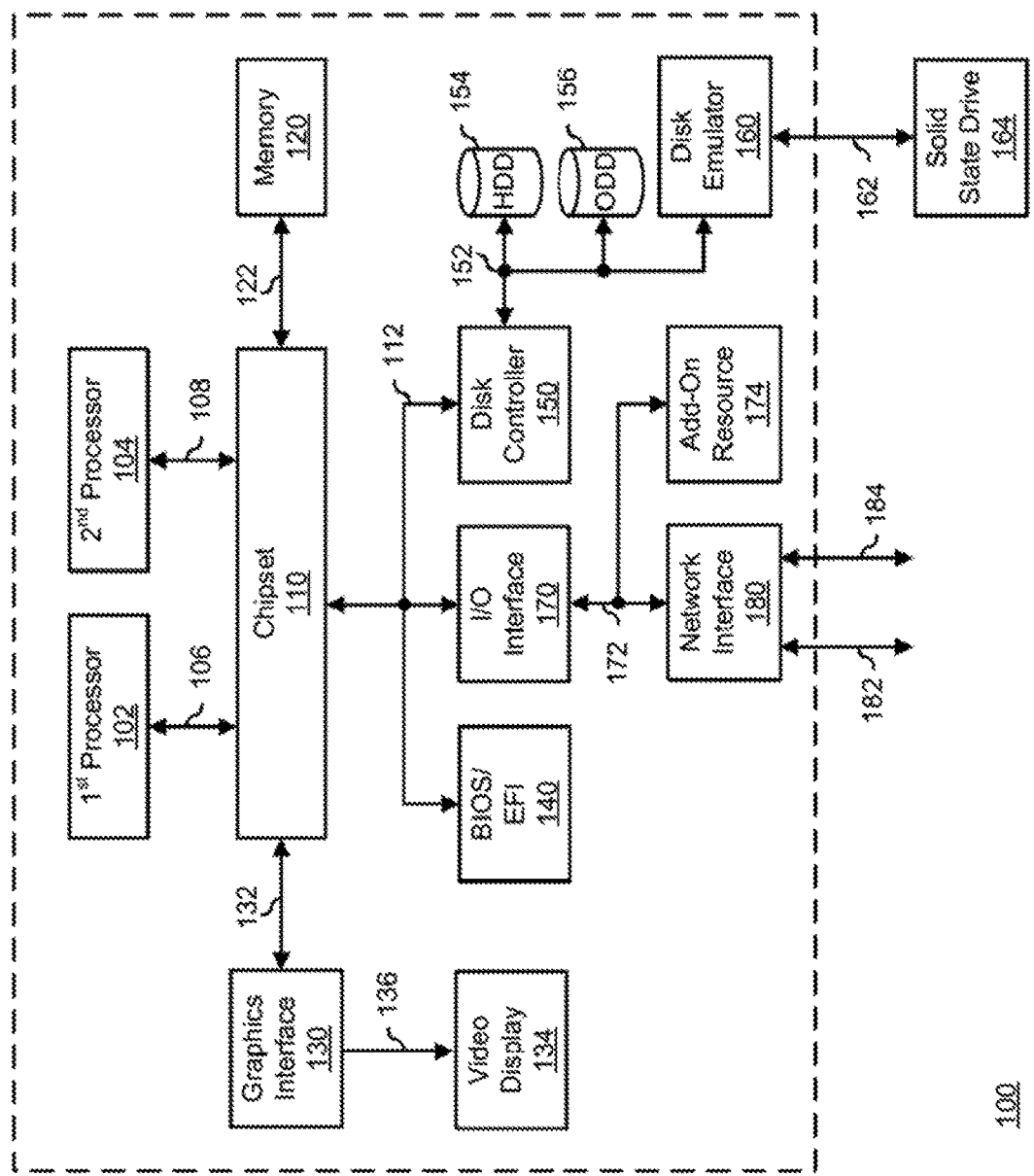
FIG. 1 is a block diagram illustrating an information handling system according to an embodiment of the present disclosure.

FIG. 1 illustrates a generalized embodiment of information handling system 100, according to exemplary embodiments. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller 150 to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

Figure 2:
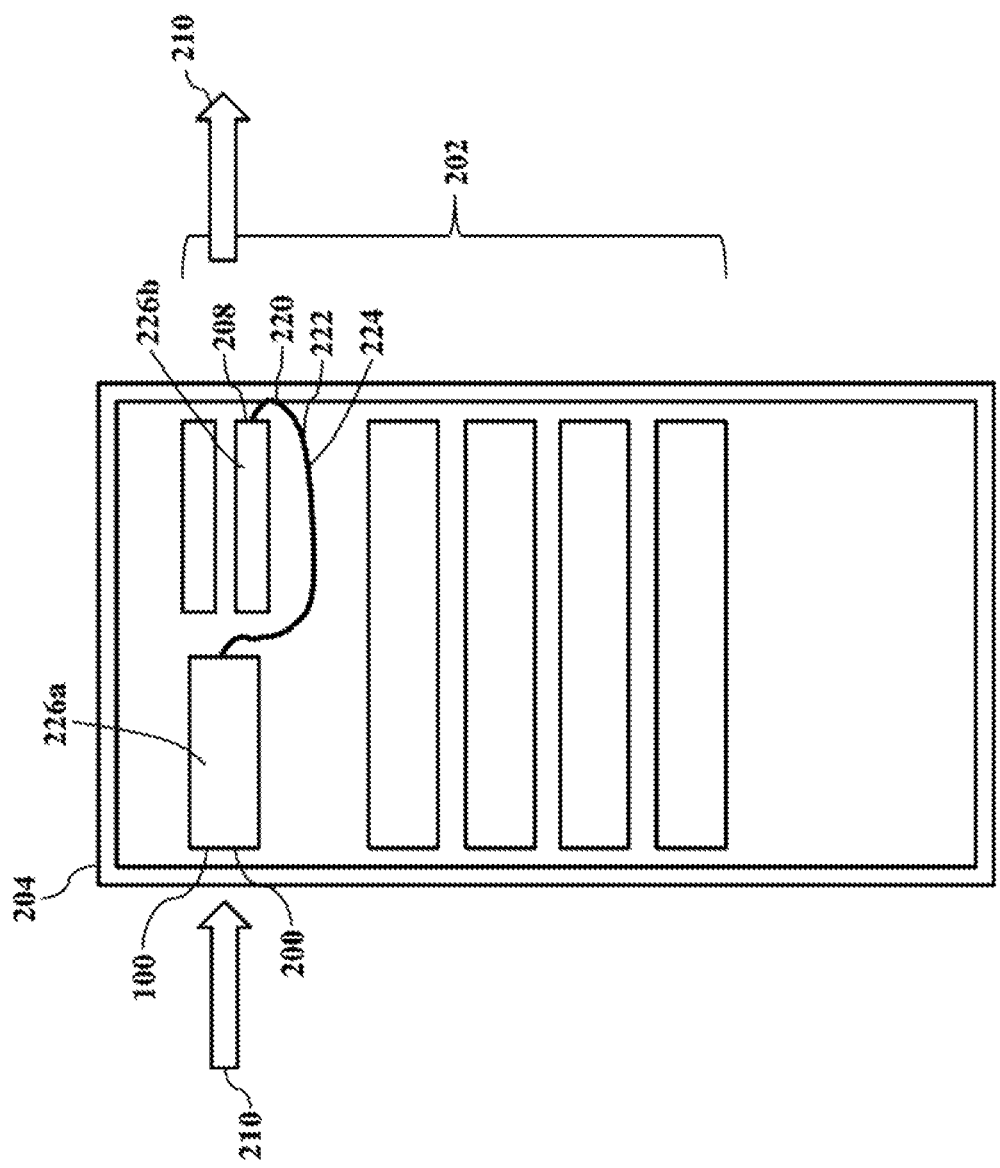
FIG. 2 illustrates the information handling system as an Ethernet switch installed in a rack.

FIG. 2 is another illustration of the information handling system 100, according to exemplary embodiments. Here the information handling system 100 is illustrated as an intelligent, processor-controlled cooling system 200. The cooling system 200 provides thermal management for internal componentry 202 installed in a rack 204. The rack 204 resembles a cabinet having internal shelves or rails for housing or stacking information technology equipment. The rack 204 may have lockable front and rear doors (not shown for simplicity) for added security.

The cooling system 200 adds a convective cooling effect. When the internal componentry 202 (such as an Ethernet switch 208) receives electrical power and/or operates, the internal componentry generates waste heat. The cooling system 200 draws or intakes cooler ambient air 210 from outside the rack 204. The cooling system 200 then pushes or blows the ambient air 210 across or through the internal componentry for a convective cooling effect.

Here, though, the cooling system 200 receives electrical power 220 via an Ethernet connection 222. That is, the cooling system 200 has a physical data cable 224 that plugs into, or mates with, an Ethernet port (not shown for simplicity) in the Ethernet switch 208. The cooling system 200 and the Ethernet switch 208 may have PoE interfaces 226a and 226b. The physical data cable 224 may thus carry or convey Ethernet signals and the electrical power 220, such as current and voltage, according to the IEEE 802.3 standard (PoE and PoE+). The Ethernet switch 208, in other words, supplies the electrical power 220 via the physical data cable 224 to operate the cooling system 200. The cooling system 200 injects the cooler ambient air 210 into the rack 204 (such as in the vicinity of the Ethernet switch 208), thus lowering the net operating temperature to within a preferred temperature threshold, specification, and/or range of values. Information technology personnel are able to maintain a clean front-of-rack appearance and maintain rack best practices by separating the cold domain from the hot.

Moreover, power consumption in the rack 204 is mostly equivalent. Rack power is virtually the same whether powered by PoE or AC/DC power supply. For example, while powered by PoE, the cooling system 200 benefits from whatever redundancy the Ethernet switch 208 offers. Conventional Ethernet switches with just an AC/DC supply are unlikely to incur the expense to implement redundant PoE power.

Figure 3:
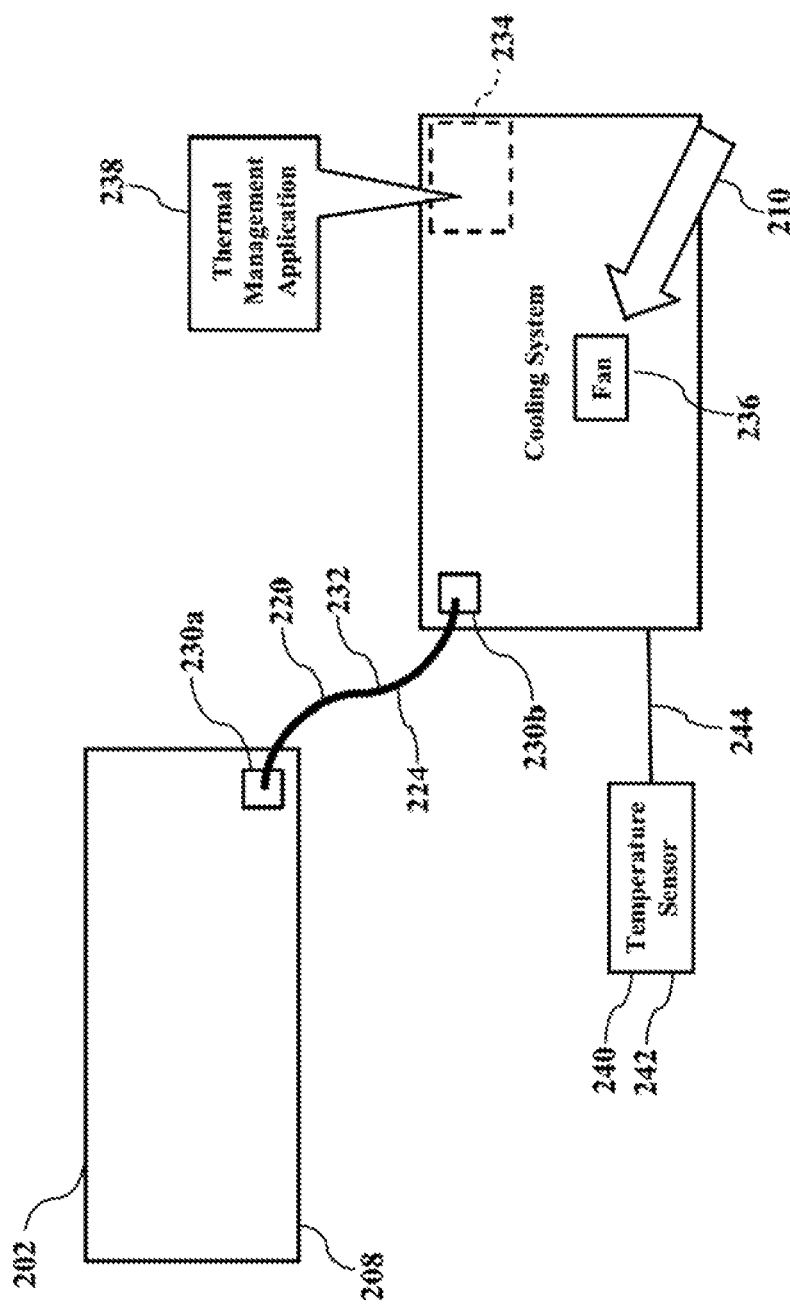
FIG. 3 illustrates a power scheme, according to exemplary embodiments.

FIG. 3 illustrates a power scheme, according to exemplary embodiments. Any of the internal componentry 202 (such as the Ethernet switch 208) has a PoE port 230a for outputting Ethernet signals 232 and for sourcing the electrical power 220. The cooling system 200 also has a PoE port 230b for receiving the Ethernet signals 232 and for receiving or delivering the electrical power 220 supplied via the physical data cable 224. The cooling system 200 thus consumes the electrical power 220 present on the mating terminal pins in the PoE port 230b. The cooling system 200 also has an internal controller 234 (such as the hardware processor 102/104 and the memory 120 above discussed) and one (1) or more cooling fans 236. The internal controller 234 executes a thermal management application 238 (perhaps stored in the memory 120). The internal controller 234 may also interface with a temperature sensor 240 that senses a temperature 242. The temperature sensor 240 is generally placed or installed within proximity to the internal componentry 202. That is, while FIG. 3 illustrates the temperature sensor 240 being a separate component and coupled to and/or remote from the cooling system 200, the temperature sensor 240 may be an integrated component and/or locally within the cooling system 200. Regardless, the temperature sensor 240 may generate an output value 244 (such as a current or voltage) in relation to the temperature 242. When the internal controller 234 receives or determines the output value 244, the thermal management application 238 instructs the internal controller 234 to compare against one or more threshold values, temperature specifications, and/or ranges of values. If the output value 244 fails to satisfy any logical rule or number, then the thermal management application 238 may instruct the internal controller 234 to activate the fan 236. That is, the internal controller 234 causes at least some of the electrical power 220 to be supplied to the cooling fan 236. The internal controller 234 may even cause or perform power conversion (such as AC-to-DC), if necessary. Regardless, as the cooling fan 236 operates and spins, the cooler ambient air 210 is drawn through the cooling system 200 and pushed to provide the convective cooling effect.

Figure 4:
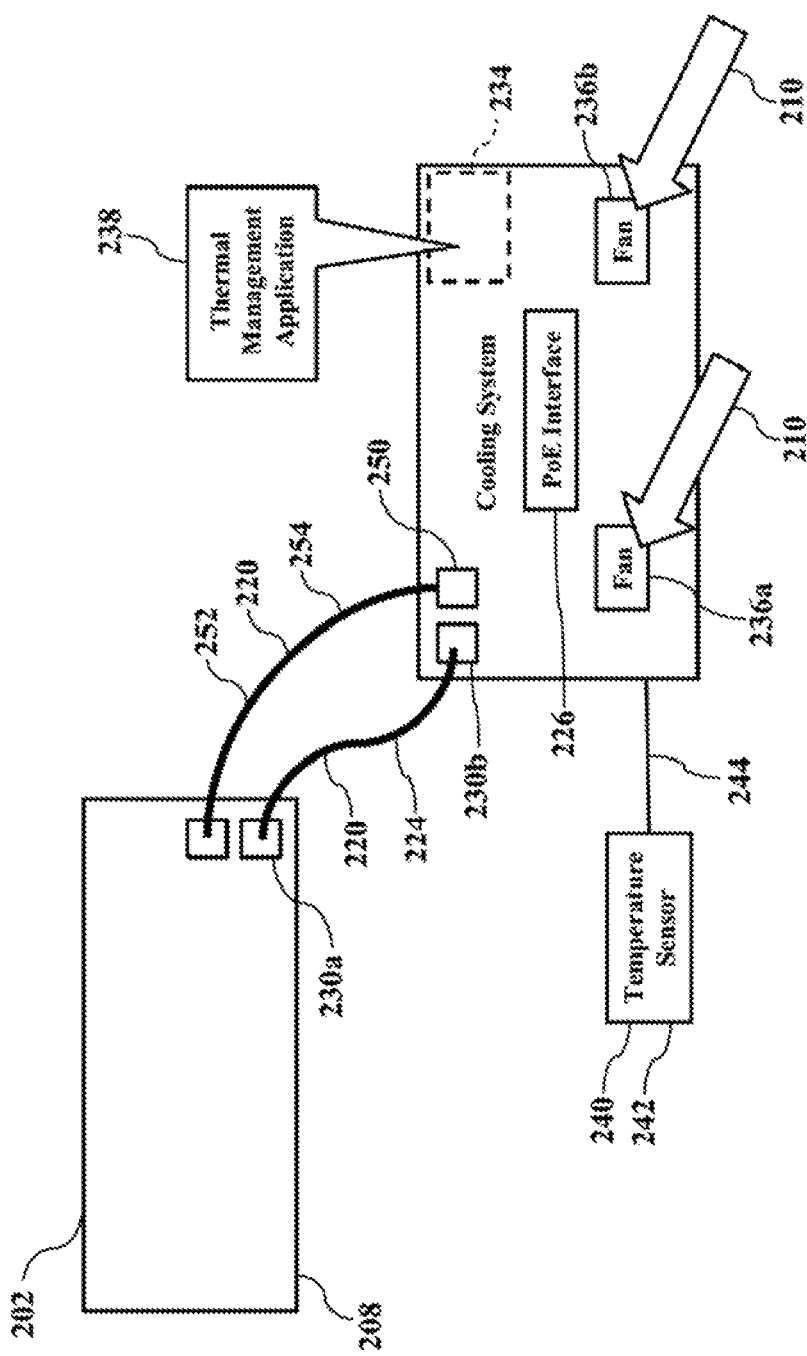
FIG. 4 illustrates multiple cooling fans, according to exemplary embodiments.

FIG. 4 illustrates multiple cooling fans 236a and 236b, according to exemplary embodiments. Here the cooling system 200 may have multiple cooling fans 236 that are electrically powered via the PoE interface 226. While the cooling system 200 may have any number of cooling fans, FIG. 4, for simplicity, illustrates the two cooling fans 236a and 236b. That is, the cooling system 200 has the PoE port 230b for receiving the Ethernet signals 232 and for receiving or delivering the electrical power 220 supplied via the physical data cable 224. The PoE port 230b may thus be dedicated to delivering the electrical power 220 to the first cooling fan 236a. The cooling system 200 may also have a second powered Ethernet port 250 for receiving additional Ethernet signals 252 (via a second physical data cable 254) and for receiving or delivering an additional amount of the electrical power 220 to the second cooling fan 236b. Each cooling fan 236a and 236b, in other words, may be associated with or dedicated to its respective PoE port 230b and the second powered Ethernet port 250. The internal controller 234 may thus respectively command either or both cooling fans 236a and 236b in response to the output value 244 generated by the temperature sensor 240. If more than the two cooling fans 236a and 236b are desired, exemplary embodiments may include additional, corresponding Ethernet ports.

Figure 5:
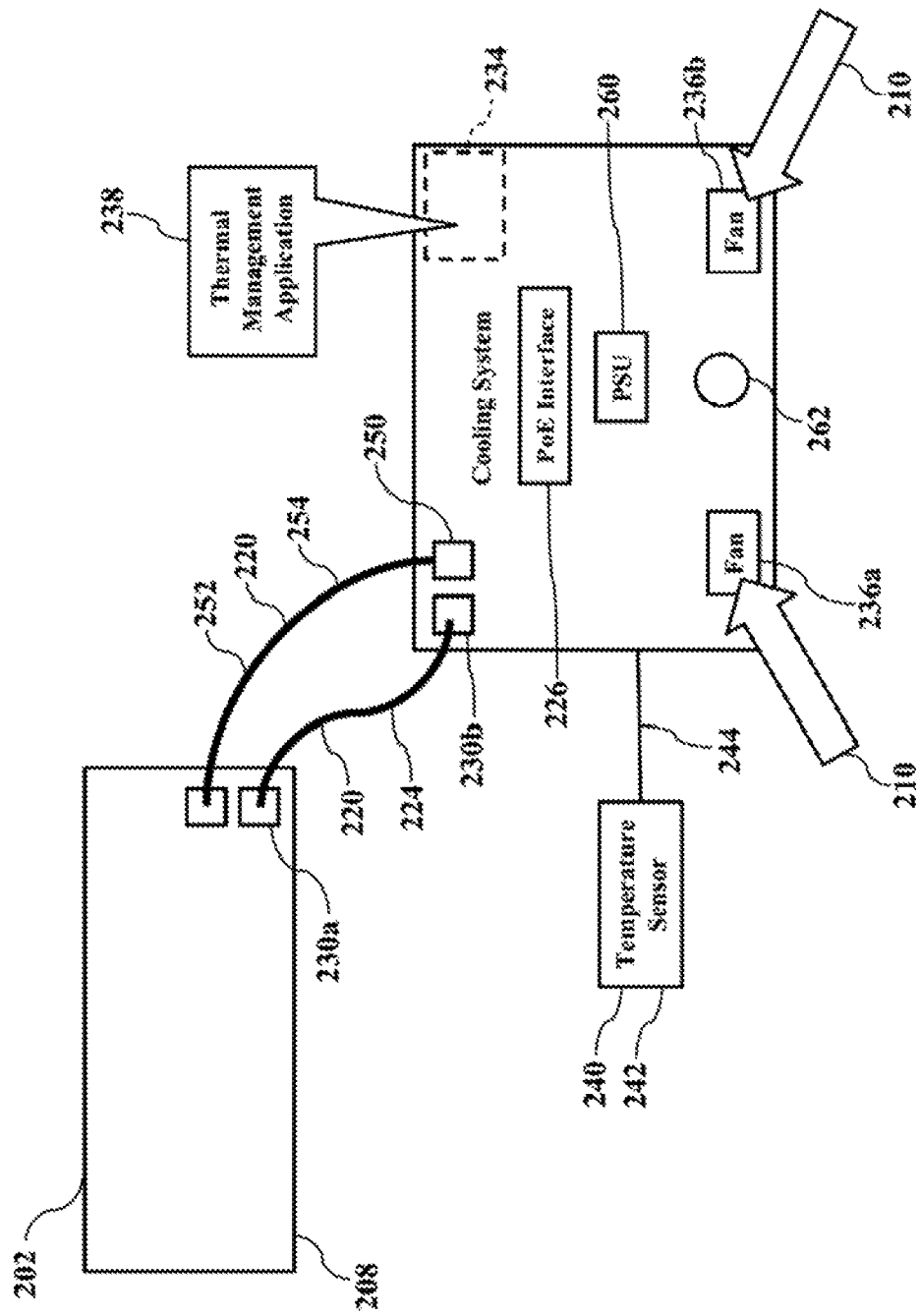
FIG. 5 illustrates a dual-power scheme, according to exemplary embodiments.

FIG. 5 illustrates a dual-power scheme, according to exemplary embodiments. Here the cooling system 200 may additionally include a conventional power supply unit (PSU) 260. That is, the cooling system 200 may additionally have the PSU 260 that accepts alternating current electrical power (such as that supplied by an electrical grid) and converts into direct current electrical power. The thermal management application 238 may thus instruct the internal controller 234 to select either the PoE interface 226 or the PSU 260, depending on design choice, performance objectives, and any other considerations. The cooling system 200 may further have a visual indicator 262 (such as a dual-color light emitting diode) to inform a user of the power source. The cooling system 200 may thus be powered by either AC/DC or PoE. Currently, the cooling fans 236a and 236b may require 44-46 Watts, which can be powered by two (2) twenty five (25) Watt Ethernet ports. As PoE improves and fans become more electrically efficient, less wattage and/or Ethernet ports may be required. Exemplary embodiments thus incorporate the functionality of a PoE as a power resource and use that technology to drive the cooling fans 236a and 236b from one or more PoE devices—such as the PoE-enabled Ethernet switch 208.

Figure 6:
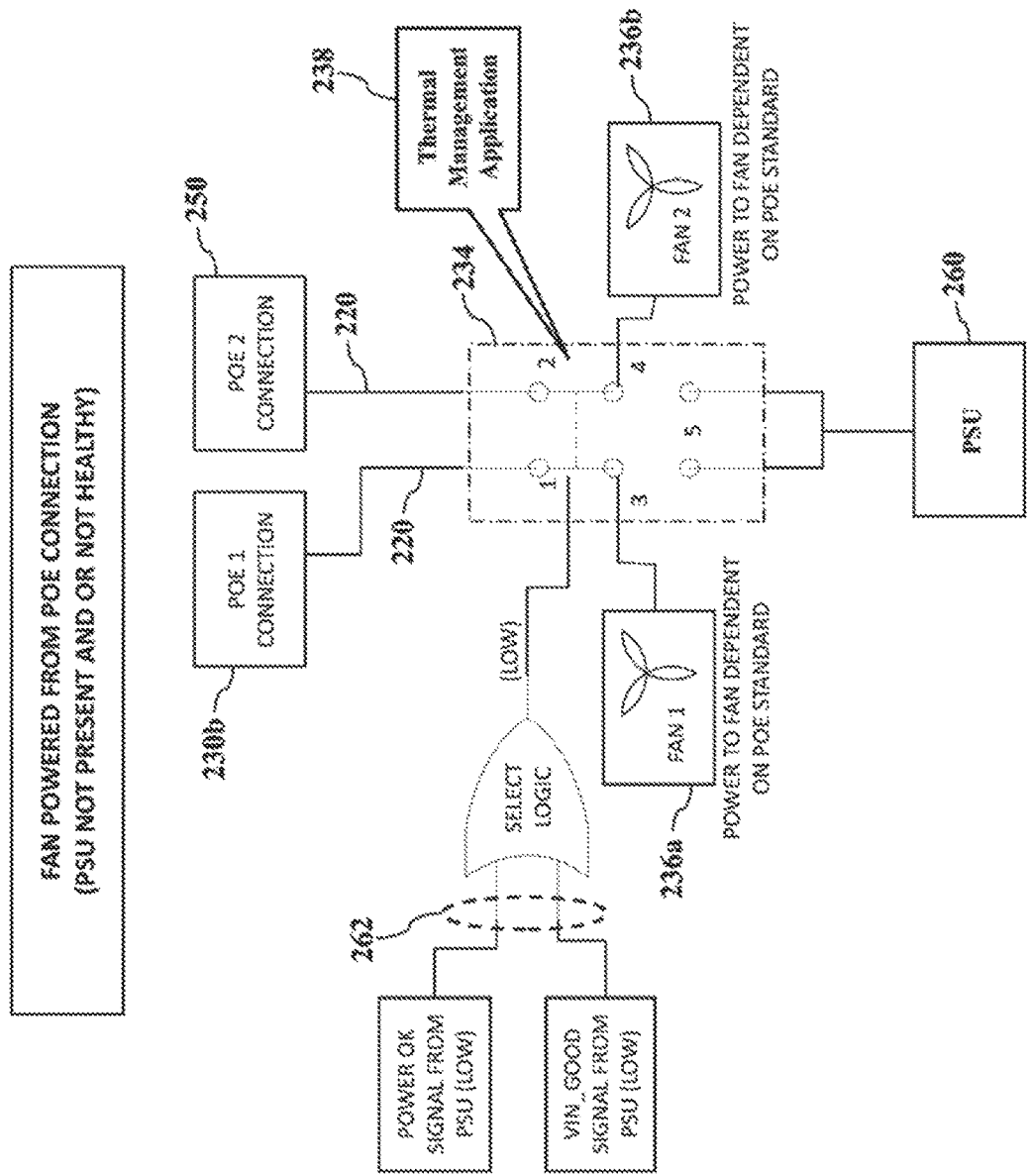
Figure 7:
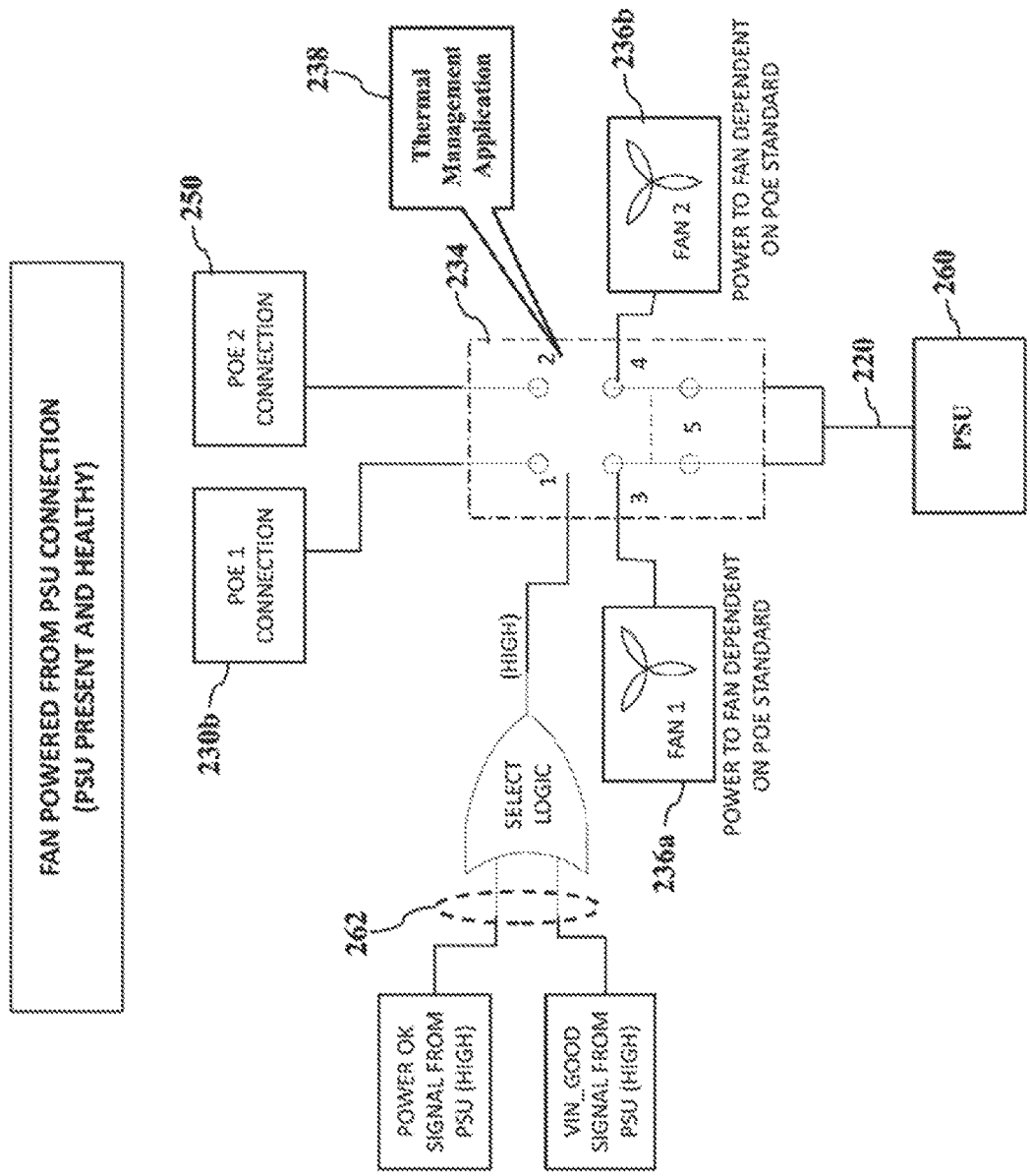

FIGS. 6-8 illustrate logical and electrical connections, according to exemplary embodiments. FIGS. 6-7 illustrate different power strategies, while FIG. 8 illustrates a logical decision table for physical connections within the cooling system 200. In FIG. 6, for example, the conventional PSU 260 is unavailable or unhealthy to provide electrical power. The internal controller 234 may thus receive a low or null/zero signal 262 representing the operational state of the PSU 260. The thermal management application 238 may thus instruct the internal controller 234 to open or ignore an electrical connection to the PSU 260. The thermal management application 238, instead, may thus instruct the internal controller 234 to implement PoE delivery. The internal controller 234, for example, causes a first physical, electrical connection between the PoE port 230b and the first cooling fan 236a. The internal controller 234 may also cause a second physical, electrical connection between the second powered Ethernet port 250 and the second cooling fan 236b. The electrical power 220 is thus delivered to spin the respective cooling fans 236a and 236b.

As FIG. 7 illustrates, though, exemplary embodiments may favor or prefer conventional electrical power. For example, if the PSU 260 is present and healthy, then the internal controller 234 may receive a high signal or value 262 representing the operational state of the PSU 260. The thermal management application 238 may thus instruct the internal controller 234 to open or ignore PoE delivery. The thermal management application 238, instead, may instruct the internal controller 234 to connect an output of the PSU 260 in parallel to the first cooling fan 236a and to the second cooling fan 236b. The PSU 260 thus provides the electrical power 220 to spin the respective cooling fans 236a and 236b.

Exemplary embodiments may also negotiate the electrical power 220. Once Ethernet communication is established with the cooling system 200, parameters may be established. For example, the internal controller 234 and the Ethernet switch 208 may handshake and specify the electrical power 220 required to be delivered via the first PoE port 230b and/or the second powered Ethernet port 250. Ethernet communications, in other words, may be used to communicate the voltage/current requirements for operating the respective cooling fans 236a and 236b. The IEEE 802.3 standard (PoE and PoE+) would allow a negotiation of power source/delivery.

Exemplary embodiments may also include sharing of the electrical power 220. The single powered Ethernet port 236a, in other words, may be used to supply the electrical power 220 to both the cooling fans 236a and 236b. For example, if the cooling fans 236a and 236b were small and/or electrically efficient, the single powered Ethernet port 236a could supply enough of the electrical power 220 for simultaneous operation.

Figure 9:
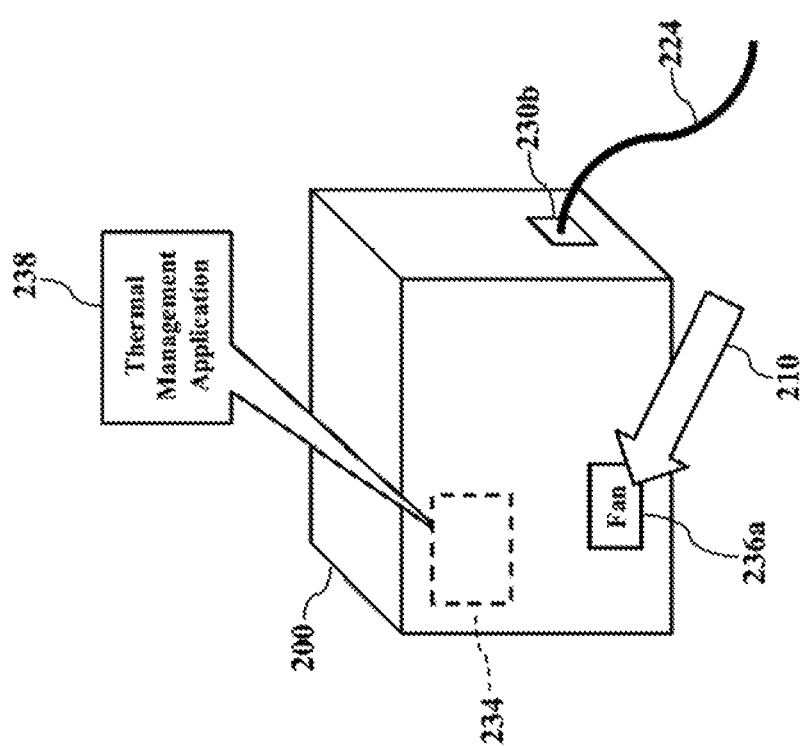
FIG. 9 illustrates a stand alone, modular design, according to exemplary embodiments.

FIG. 9 illustrates a stand alone, modular design, according to exemplary embodiments. Here the cooling system 200 may be a separate component that is added for localized cooling of networking equipment. If localized cooling is needed in any environment, the cooling system 200 may be placed and plugged for quick and simple operation. Consider, for example, that many wireless access points are installed in closets or other cramped environments where airflow is minimal and ambient temperatures are high. The cooling system 200 may thus be easily and portably installed in the same closet and plugged in via the physical data cable 224. The cooling system 200 provides nearly immediate temperature relief with minimal installation effort.

Exemplary embodiments may utilize any sensing technology and location. The temperature sensor 240 may be a thermistor, thermocouple, transistor, transducer, or any other means for generating an electrical signal in response to a temperature (temperature difference). Moreover, regardless of the sensor technology, the temperature sensor 240 may be positioned or operate at any location within the rack 204 that best reflects a particular regional temperature.

Figure 10:
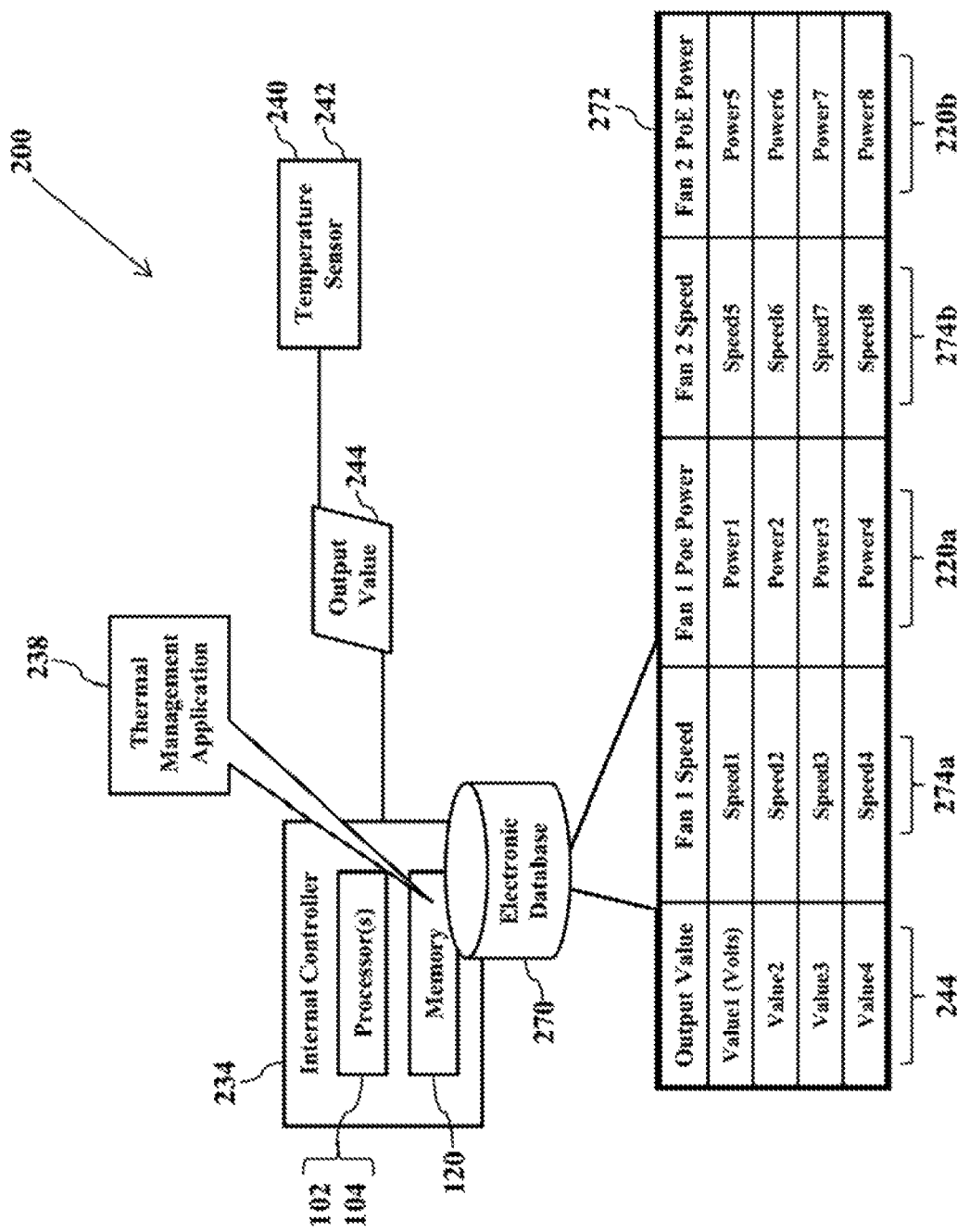
FIG. 10 illustrates PoE voltage values, according to exemplary embodiments.

FIG. 10 illustrates PoE voltage values, according to exemplary embodiments. When the internal controller 234 receives the output value 244 generated by the temperature sensor 240, the internal controller 234 may command the fan(s) 236 to operate and/or spin, according to the output value 244 (representing the temperature 242). The thermal management application 238, for example, may instruct the internal controller 234 to query an electronic database 270 for the output value 244 generated by the temperature sensor 240. While the electronic database 270 may have any physical or electronic construction, for simplicity FIG. 10 illustrates the electronic database 270 as a table 272 that maps, relates, or associates different output values 244 to their corresponding rotational speed 274 and PoE power values 220. Higher temperature values, represented by greater output value 244 generated by the temperature sensor 240, may require greater electrical power 220 sourced or delivered via the IEEE 802.3 standard (PoE and PoE+). While FIG. 10 only illustrates a few entries in the table 272, in practice the electronic database 270 may have many entries for many different operating parameters. Exemplary embodiments may thus perform a database lookup and identify and/or retrieve the PoE power value 220 having an electronic association with the output value 244 generated by the temperature sensor 240. Once the PoE power value 220 is identified, the internal controller 234 may cause delivery of the pre-defined power 220.

As FIG. 10 further illustrates, multiple fans may be required. For example, some output values 244 (generated by the temperature sensor 240) may require a combined performance or contribution from multiple fans (such as 236a and 236b above explained). That is, some elevated temperatures 242 may require both fans 236a and 236b to spin for adequate cooling. The electronic database 270 may thus have entries that specify their corresponding rotational speeds 274a and 274b and their corresponding PoE power values 220a and 220b. Again, then, a quick database lookup may be used to ensure the cooling system 200 performs to predetermined specifications.

Exemplary embodiments may utilize other power strategies. For example, the thermal management application 238 may determine the total number of PoE ports that are required. As a simple example, assume that a single PoE+ port may provide a maximum of 30 Watts. If the electronic database 270 reveals that 45 Watts are required, then two (2) PoE+ ports are required. The thermal management application 238 may thus divide the PoE power value 220 by the maximum electrical power deliverable via a single PoE+ port. If the resulting quotient value is greater than 1.0, then the thermal management application 238 may round up and select another PoE+ port to provide additional electrical power 220.

When referred to as a device, a module, or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A memory device storing instructions that when executed cause a hardware processor to perform operations, the operations comprising:

receiving a signal representing an inoperable state of a power supply unit that supplies an electrical power to a cooling system that cools an Ethernet switch installed in a rack;

in response to the receiving of the signal representing the inoperable state of the power supply unit, disconnecting the cooling system from the power supply unit by opening an electrical connection between the cooling system and the power supply unit;

connecting the cooling system to a first Ethernet port of the Ethernet switch via a power-over-Ethernet cable to receive an electrical power delivered from the Ethernet switch;

receiving an output value generated by a temperature sensor, the output value representing a temperature associated with the Ethernet switch; and supplying the electrical power delivered via the power-over-Ethernet cable from the Ethernet switch to a fan of the cooling system, the electrical power causing the fan to spin and to move an ambient air according to the output value generated by the temperature sensor.

2. The memory device of claim 1, wherein the operations further comprise dedicating the electrical power delivered via the power-over-Ethernet cable to the fan.

3. The memory device of claim 1, wherein the operations further comprise receiving an additional electrical power delivered via another power-over-Ethernet cable.

4. The memory device of claim 3, wherein the operations further comprise dedicating the additional electrical power to another fan of the cooling system.

5. The memory device of claim 4, wherein the operations further comprise supplying the additional electrical power to another fan.

6. The memory device of claim 3, wherein the operations further comprise connecting a second Ethernet port of the Ethernet switch to a second fan.

7. A method, comprising:
receiving, by a controller, a signal representing an inoperable state of a power supply unit that supplies an electrical power to a cooling system that cools an Ethernet switch;
in response to the receiving of the signal representing the inoperable state of the power supply unit, disconnecting, by the controller, the cooling system from the power supply unit by opening an electrical connection between the cooling system and the power supply unit;
connecting, by the controller, the cooling system to a first Ethernet port of the Ethernet switch via a power-over-Ethernet cable to receive an electrical power delivered from the Ethernet switch;
receiving an output value representing a temperature associated with the Ethernet switch; and
supplying the electrical power delivered via the power-over-Ethernet cable from the Ethernet switch to a fan of the cooling system, the electrical power causing the fan to move an ambient air according to the output value.

8. The method of claim 7, further comprising dedicating the electrical power delivered via the power-over-Ethernet cable to the fan.

9. The method of claim 7, further comprising receiving an additional electrical power delivered via another power-over-Ethernet cable.

10. The method of claim 9, further comprising dedicating the additional electrical power to another fan of the cooling system.

11. The method of claim 9, further comprising supplying the additional electrical power to another fan.

12. The method of claim 7, further comprising connecting a second Ethernet port of the Ethernet switch to a second fan.

13. An information handling system, comprising:
a hardware processor; and
a memory device accessible to the hardware processor, the memory device storing instructions that when executed cause the hardware processor to perform operations including:
receiving a signal representing an inoperable state of a power supply unit that supplies an electrical power to a cooling system that cools an Ethernet switch;
in response to the receiving of the signal representing the inoperable state of the power supply unit, disconnecting the cooling system from the power supply unit by opening an electrical connection between the cooling system and the power supply unit;
connecting the cooling system to a first Ethernet port of the Ethernet switch via a power-over-Ethernet cable to receive an electrical power delivered from the Ethernet switch;
receiving an output value representing a temperature associated with the Ethernet switch; and
supplying the electrical power delivered via the power-over-Ethernet cable from the Ethernet switch to a fan of the cooling system, the electrical power causing the fan to spin and to move an ambient air according to the output value.

14. The information handling system of claim 13, wherein the operations further comprise dedicating the electrical power delivered via the power-over-Ethernet cable to the fan.

15. The information handling system of claim 13, wherein the operations further comprise receiving an additional electrical power delivered via another power-over-Ethernet cable.

16. The information handling system of claim 15, wherein the operations further comprise dedicating the additional electrical power to another fan of the cooling system.

17. The information handling system of claim 15, wherein the operations further comprise supplying the additional electrical power to another fan.

18. The information handling system of claim 13, wherein the operations further comprise connecting a second Ethernet port of the Ethernet switch to a second fan.

* * * * *